US010878864B2

(12) United States Patent
Cosemans

(10) Patent No.: US 10,878,864 B2
(45) Date of Patent: Dec. 29, 2020

(54) MULTIPLE DATA RATE MEMORY

(71) Applicant: SURECORE LIMITED, Leeds (GB)

(72) Inventor: Stefan Cosemans, Leeds (GB)

(73) Assignee: SURECORE LIMITED, Sheffield (GB)

( * ) Notice: Subject to any disclaimer, the term of this patent is extended or adjusted under 35 U.S.C. 154(b) by 2 days.

(21) Appl. No.: 16/081,509

(22) PCT Filed: Feb. 27, 2017

(86) PCT No.: PCT/GB2017/050524
§ 371 (c)(1),
(2) Date: Aug. 31, 2018

(87) PCT Pub. No.: WO2017/149282
PCT Pub. Date: Sep. 8, 2017

(65) Prior Publication Data

US 2019/0080735 A1 Mar. 14, 2019

(30) Foreign Application Priority Data

Mar. 1, 2016 (GB) .................................. 1603589.1

(51) Int. Cl.
*G11C 7/22* (2006.01)
*G11C 7/10* (2006.01)
(Continued)

(52) U.S. Cl.
CPC ............ *G11C 7/222* (2013.01); *G11C 7/1039* (2013.01); *G11C 7/1072* (2013.01); *G11C 7/227* (2013.01);
(Continued)

(58) Field of Classification Search
CPC ..... G11C 7/222; G11C 11/419; G11C 11/418; G11C 8/18; G11C 7/227; G11C 7/1072; G11C 7/1039
See application file for complete search history.

(56) References Cited

U.S. PATENT DOCUMENTS 5,915,105 A * 6/1999 Farmwald ............. G11C 29/88
710/305
8,824,237 B2 * 9/2014 Wang ...................... G11C 8/10
365/226

(Continued)

OTHER PUBLICATIONS

International Search Report and Written Opinion dated May 18, 2017, from International Application No. PCT/GB2017/050524, 12 pages.

(Continued)

*Primary Examiner* — Khamdan N. Alrobaie
(74) *Attorney, Agent, or Firm* — Meunier Carlin & Curfman LLC

(57) ABSTRACT

There is provided a multiple data rate memory comprising a clock splitting circuit and a multiplexing address latch. The clock splitting circuit is configured to generate first and second internal clock pulses from a rising edge of an external clock signal and to provide the first and second internal clock signals to the multiplexing address latch. The multiplexing address latch is configured to output a first address signal in response to the first internal clock pulse and a second address signal in response to the second internal clock pulse.

28 Claims, 10 Drawing Sheets

(51) Int. Cl.
*G11C 8/18* (2006.01)
*G11C 11/418* (2006.01)
*G11C 11/419* (2006.01)

(52) U.S. Cl.
CPC .............. *G11C 8/18* (2013.01); *G11C 11/418* (2013.01); *G11C 11/419* (2013.01)

(56) References Cited

U.S. PATENT DOCUMENTS

| | | | | |
|---|---|---|---|---|
| 2001/0038568 | A1* | 11/2001 | Lim | G11C 7/22 365/233.1 |
| 2002/0145936 | A1* | 10/2002 | Maeda | G11C 7/1051 365/233.1 |
| 2006/0104148 | A1* | 5/2006 | Yang | G11C 7/1072 365/233.1 |
| 2007/0109909 | A1 | 5/2007 | Jung | |
| 2009/0231937 | A1 | 9/2009 | Jung et al. | |
| 2015/0009774 | A1* | 1/2015 | Ko | G11C 8/06 365/230.08 |
| 2015/0256183 | A1* | 9/2015 | Park | G11C 7/222 327/115 |
| 2016/0055903 | A1 | 2/2016 | Yoon et al. | |
| 2016/0358637 | A1* | 12/2016 | Bu | G11C 8/16 |

OTHER PUBLICATIONS

International Preliminary Report on Patentability dated Feb. 5, 2018, from International Application No. PCT/GB2017/050524, 16 pages.

* cited by examiner

MULTIPLE DATA RATE MEMORY

TECHNICAL FIELD

The present invention relates to multiple data rate memory providing digital data storage. In particular, the present invention provides an improved memory unit that can implement multiple memory accesses from just the rising edge of an external clock signal.

BACKGROUND

Data storage is an essential requirement for virtually all modern digital electronic systems. Static read/write memory (SRAM) comprises a major part of that function, being relatively easy to integrate into a semiconductor device together with large amounts of logic, thus offering fast access and low power. With the advent of deep sub-micron (DSM) geometry silicon processing, the task of implementing reliable storage whilst simultaneously maintaining low power consumption becomes increasingly problematic, whilst conversely demand rises with the proliferation of battery-powered electronic gadgets requiring progressively larger memories.

The most commonly-used design of SRAM memory cell is the 6-transistor circuit shown in FIG. 1 and consists of a storage element made up of two back-to-back/cross-coupled inverters ([MN1, MP1] and [MN2, MP2]) 11*a*, 11*b*, 12*a*, 12*b* with access transistors (MA1 and MA2) 16*a*, 16*b* which are turned ON by means of a word line control (WL) to form a conducting path between the data storage nodes (N1 and N2) 13, 14 of the cell and the complementary bit lines (BLA and BLB).

A write operation, in which a data value is written to a memory cell, is achieved by forcing a high voltage onto one of BLA or BLB whilst simultaneously forcing a low voltage onto the other, and then driving the word line (WL) high to activate the access path allowing the voltage levels held on the bit lines (BLA and BLB) to overcome the state of the storage element. The word line is then driven low to disconnect the memory cell with its data store held in its new state.

A read operation in which a data value stored in a memory cell is read, is achieved by initially driving both bit lines to a notionally high voltage level before then driving the word line (WL) high. One of either BLA or BLB will then be pulled low through the access devices (MA1 and MA2) by the low voltage side of the storage element. The complementary bit lines are attached to inputs of a sense amplifier (not shown) that is part of the read circuitry which is used when data is read from the memory. A sense amplifier senses the low level signals present on the bit lines which represent the data value (i.e. either a '1' or a '0') stored in a given memory cell, and amplifies the small voltage swing to recognisable logic level so that the data can be interpreted properly by logic outside the memory. The difference in voltage levels between the two bit lines can therefore be sensed by the sense amplifier and used to determine the data value (i.e. '1' or '0'). The decision levels representing a '1' and a '0' will have been pre-determined during the circuit design phase and applied by the sense amplifier.

FIG. 2 illustrates a conventional memory unit wherein the memory cells are arranged in a two-dimensional array consisting of horizontal rows and vertical columns. Each memory cell in the array is connected to a word line that runs horizontally across a row of the array and to a pair of bit lines that run vertically within the columns. By convention the word lines are always said to run along the rows of an array of memory cells whilst the bit lines are always said to run down the columns of an array of memory cells, irrespective of the orientation of the array. The word lines are driven by a row decoder that takes an m-bit address and produces $2^m$ word line enable signals. Each pair of bit lines is then driven by a column decoder that takes an n-bit address and produces $2^n$ bit line signals.

In order to reduce delay and power dissipation, a number of different partitioning approaches have been used in which the memory array is partitioned into a number of smaller blocks that can be separately accessed. In particular, it is common for a memory array to be partitioned by the use of divided/hierarchical word lines and divided/hierarchical bit lines.

In a hierarchical word line arrangement, instead of a single word line that runs the complete width of a row of memory cells and connects to each cell in the row, a multi-level structure is used. Effectively, a single word line is broken up into multiple "local word lines", each of which connects to a group of memory cells in a part of a row of the array. A "global word line" then runs the width of the row and is connected to each of the local word lines in that column via gates/switches.

Similarly, in a hierarchical bit line arrangement in which, instead of a single bit line that runs the complete height of a column of memory cells and connects to each cell in the column, another multi-level structure is used. Effectively, a single bit line is broken up into multiple "local bit lines", each of which connects to a group of memory cells in a part of a column of the array. A "global bit line" also runs the height of the column, and is connected to each of the local bit lines in that column via a local-to-global interface. The memory read and write circuits connect to the global bit line, and not directly to the local bit line. During a memory access, only a local bit line in the relevant part of the column is connected to the global bit line.

For addressing purposes, such partitioned memory arrays are typically divided into blocks. A memory address is then made up of three components that select the block, the column, and the row of the desired word in the memory. These address bits are decoded so that the correct block is enabled and appropriate cells in that block are selected. For example, the block (BRS) and column (COLS) address bits are decoded to activate an appropriate block select signal, whilst the block (BRS) and row (WIBS) address bits are decoded to activate the appropriate global word line (GWL). The block select signal and the global word line (GWL) are then combined to activate the appropriate local word line (LWL) within the selected block.

Within an SRAM memory, the selection of the appropriate memory cells based on an input memory address is achieved using a decoder. A simple decoder is just a structure that contains a number of AND gates, where each gate is enabled for a different input value. For an n-bit to $2^n$ decoder, $2^n$ n-input AND gates are required, one for each row of memory. However, for fan-in greater than 4, these logic gates become slow and it is therefore best to break these down into multiple logic gates with small fan-in, which then also allows for any common gates to be factored out into a predecoder. Using multiple levels of decoding then provides for more efficient layouts.

Conventionally, an SRAM memory performs one access operation (read or write) per cycle (rise and fall) of a clock signal. This, however, requires that the clock signal changes twice per access, while the data lines change at most once per access. When operating at a high bandwidth, system considerations often constrain the frequency at which the clock single can operate. However, it is possible for the memory circuits to operate at multiple data rates, wherein multiple accesses occur within a single cycle of an external clock signal. For example, the memory circuits can be configured to implement access operations on both the rising and falling edges of the external clock such that the data signals operate with the same limiting frequency, thereby doubling the data transmission rate.

SUMMARY

Whilst implementing access operations on both the rising and falling edges of an external clock provides a straightforward approach to implementing multiple data rate memory, the present inventors have recognised that there are advantages to initiating multiple memory accesses from just the rising edge of an external clock signal. In particular, doing user avoids the need to control the timing of both the rising and falling edges of the external clock signal, which can be difficult for larger clock trees. The present inventors have therefore developed a multiple data rate memory that implements multiple memory accesses from just the rising edge of an external clock signal. In particular, present inventors have developed both a clock splitting circuit that can generate multiple internal clock pulses from a rising edge of an external clock signal and a multiplexing address latch for use in such a memory.

Therefore, according to a first aspect of the present invention there is provided a multiple data rate memory comprising a clock splitting circuit and a multiplexing address latch. The clock splitting circuit is configured to generate first and second internal clock pulses from a rising edge of an external clock signal and to provide the first and second internal clock signals to the multiplexing address latch. The multiplexing address latch is configured to output a first address signal in response to the first internal clock pulse and a second address signal in response to the second internal clock pulse.

The multiple data rate memory may further comprise an array of memory cells, and access control circuitry for the array of memory cells. The multiplexing address latch is then configured to output the first address signal and the second address signal to the access control circuitry. The access control circuitry may be configured to implement a first access to the array of memory cells using the first address signal, which is provided to the access control circuitry in response to the first internal clock signal, and a second access to the array of memory cells using the second address signal, which is provided to the access control circuitry in response to the second internal clock signal.

The multiplexing address latch may comprise a multiplexer and an address latch, the address latch being configured to receive and retain an address signal output by the multiplexer and to provide the received address signal to the access control circuitry. The address latch may be configured to retain the address signal output by the multiplexer until reset by a reset signal.

The multiplexer may comprise a first enable switch that is activated by the first internal clock signal and a second enable switch that is activated by the second internal clock signal, and wherein each of the first and second enable switches connects an output of the multiplexer to ground via an address signal-dependent switch.

Both the first and second enable switches may connect an output of the multiplexer to ground via a single address signal-dependent switch that is activated by a multiple data rate address signal comprising both the first address signal and the second address signal. The multiplexer may then be provided with an input through which both the first address signal and the second address signal are received as a multiple data rate signal.

Alternatively, the first enable switch connects an output of the multiplexer to ground via a first address signal-dependent switch that is activated by the first address signal and the second enable switch connects an output of the multiplexer to ground via a second address signal-dependent switch that is activated by the second address signal. The multiplexer may then be provided with a first input through which the first address signal is received and a second input through which the second address signal is received.

The first enable switch of the multiplexer may comprise a transistor having a gate connected to the first internal clock signal. Alternatively, the first enable switch of the multiplexer may comprise a first transistor connected in series with a second transistor, the first transistor having a gate connected to the first internal clock signal and the second transistor having a gate connected to an output of an inverting delay element, the first internal clock signal being provided as an input to the inverting delay element.

The second enable switch of the multiplexer may comprise a transistor having a gate connected to the second internal clock signal. Alternatively, the second enable switch of the multiplexer may comprise a first transistor connected in series with a second transistor, the first transistor having a gate connected to the second internal clock signal and the second transistor having a gate connected to an output of an inverting delay element, the second internal clock signal being provided as an input to the inverting delay element.

The multiplexing address latch may be configured to be reset by one or more reset signals.

The multiplexing address latch may further comprise a reset switch that connects an output of the multiplexer to a positive supply and that is activated by a multiple data rate reset signal for which occurrences of the reset signal occur between occurrences of the internal clock signals. The clock splitting circuit may then be further configured to generate an occurrence of the reset signal after each occurrence of the internal clock signal and before a subsequent occurrence of the internal clock signal. The reset switch may therefore comprise a transistor having a gate connected to the reset signal.

Alternatively, the multiplexing address latch may further comprises a first reset switch that connects an output of the multiplexer to a positive supply and that is activated by a first reset signal for which occurrences of the first reset signal occur after the first internal clock signal and before the second internal clock signal, and a second reset switch that connects the output of the multiplexer to a positive supply and that is activated by a second reset signal for which occurrences of the second reset signal occur after the second internal clock signal and before a subsequent internal clock signal. The clock splitting circuit may then be further configured to generate an occurrence of the first reset signal after the first internal clock signal and before the second internal clock signal and to generate an occurrence of the second reset signal after the second internal clock signal and before a subsequent internal clock signal. The first reset switch may therefore comprise a first transistor having a gate connected to the first reset signal, and the second reset switch may comprise a second transistor having a gate connected to the second reset signal.

According to a first aspect of the present invention there is provided a clock splitting circuit for generating a multiple data rate internal clock signal from a rising edge of an external clock signal. The clock splitting circuit comprises:

an edge detection circuit configured to generate a first signal in response to a rising edge of an external clock signal and to output the first signal as a first internal clock signal that initiates a first memory access;

a first timing circuit configured to, in response to the first signal, emulate delays incurred during the first memory access and thereby generate both a second signal that indicates completion of the first memory access and a third signal that is output as a second internal clock signal that initiates a second memory access; and a second timing circuit configured to, in response to the third signal, emulate delays incurred during the second memory access and thereby generate a fourth signal that indicates completion of the second memory access.

The first timing circuit may be configured to generate a first timing signal that transitions between states following the emulated delays incurred during the first memory access, to generate the second signal in response to a first transition of the first timing signal, and to generate the third signal in response to a second transition of the first timing signal.

The first timing circuit may comprise a first control latch, and one or more delay emulation circuits. The first control latch would be configured to transition an output in response to receipt of the first signal and in response to the first transition of the first timing signal. The one or more delay emulation circuits would be configured to receive the output of the first control latch as an input and output the first timing signal. The first timing circuit further comprise a first transition detection circuit configured to generate the second signal in response to a first transition of the first timing signal, and a second transition detection circuit configured to generate the third signal in response to a second transition of the first timing signal The second timing circuit may be configured to generate a second timing signal that transitions between states following the emulated delays incurred during the second memory access and to generate the fourth signal in response to a first transition of the second timing signal.

The second timing circuit may comprise a second control latch, and one or more delay emulation circuits. The second control latch may be configured to transition an output in response to receipt of the third signal and in response to the first transition of the second timing signal. The one or more delay emulation circuits may be configured to accept the output of the second control latch as an input and output the second timing signal. The second delay emulation circuit may further comprise a first transition detection circuit configured to generate the fourth signal in response to a first transition of the second timing signal.

One or both of the first delay emulation circuit and the second delay emulation circuit may comprise one or more delay emulation circuits each selected from:

a decoder delay emulation circuit configured to simulate delays incurred when decoding memory addresses during a memory access;

a bit line delay emulation circuit configured to simulate delays incurred when accessing addressed memory cells during a memory access; and a read buffer delay emulation circuit configured to simulate delays incurred when accessing addressed memory cells through a read buffer during a memory access.

BRIEF DESCRIPTION OF THE DRAWINGS

The present invention will now be more particularly described by way of example only with reference to the accompanying drawings, in which.

DETAILED DESCRIPTION

As described above, the present inventors have recognised that there are advantages to initiating multiple memory accesses from just the rising edge of an external clock signal. Consequently, there will now be described a multiple data rate memory that implements multiple memory accesses from just the rising edge of an external clock signal, and FIG. 3 illustrates schematically an example of such a multiple data rate memory.

Figure 1:
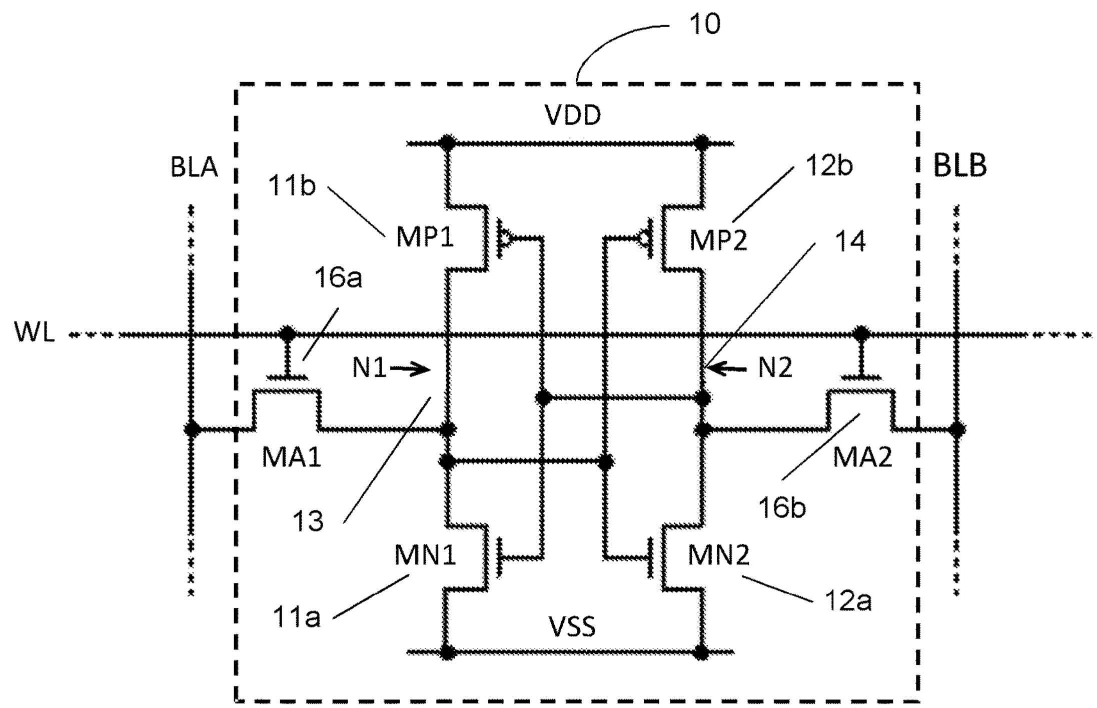
FIG. 1 illustrates a standard 6-transistor memory cell.
Figure 2:
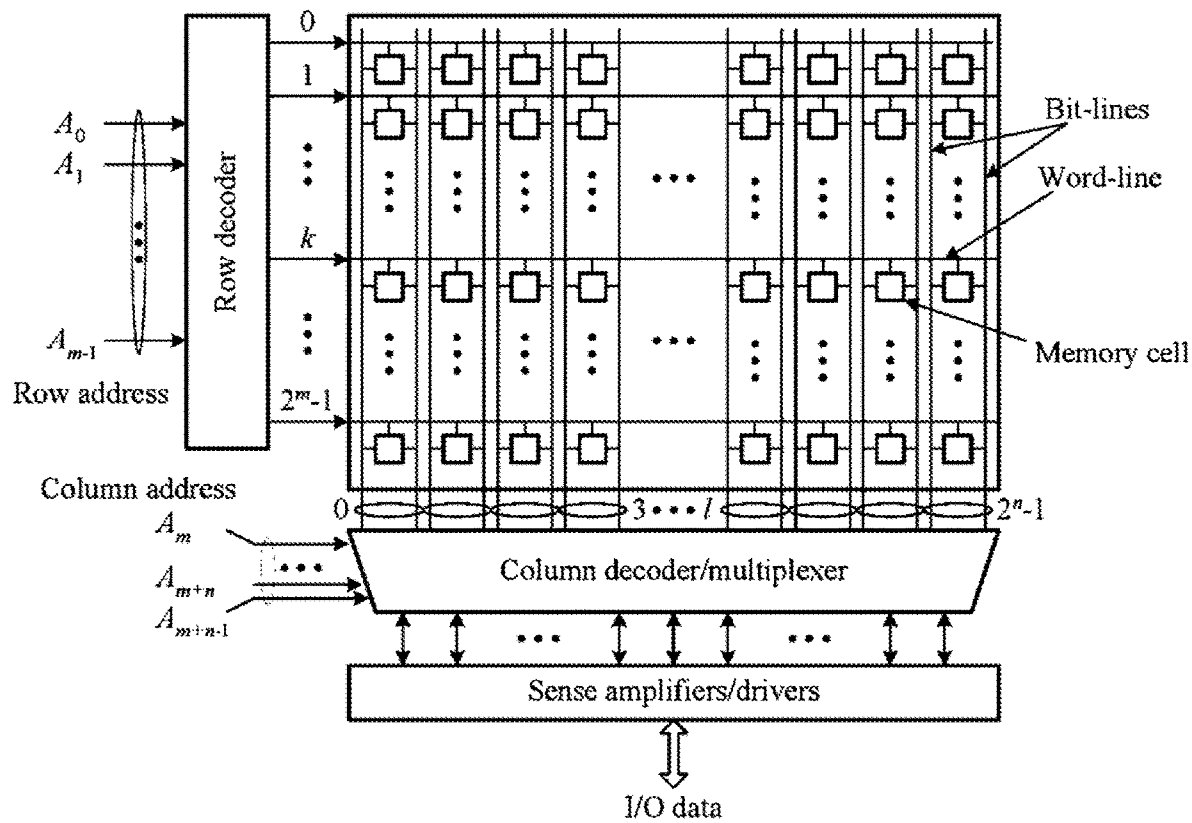
FIG. 2 illustrates an example of a conventional array of memory cells.
Figure 3:
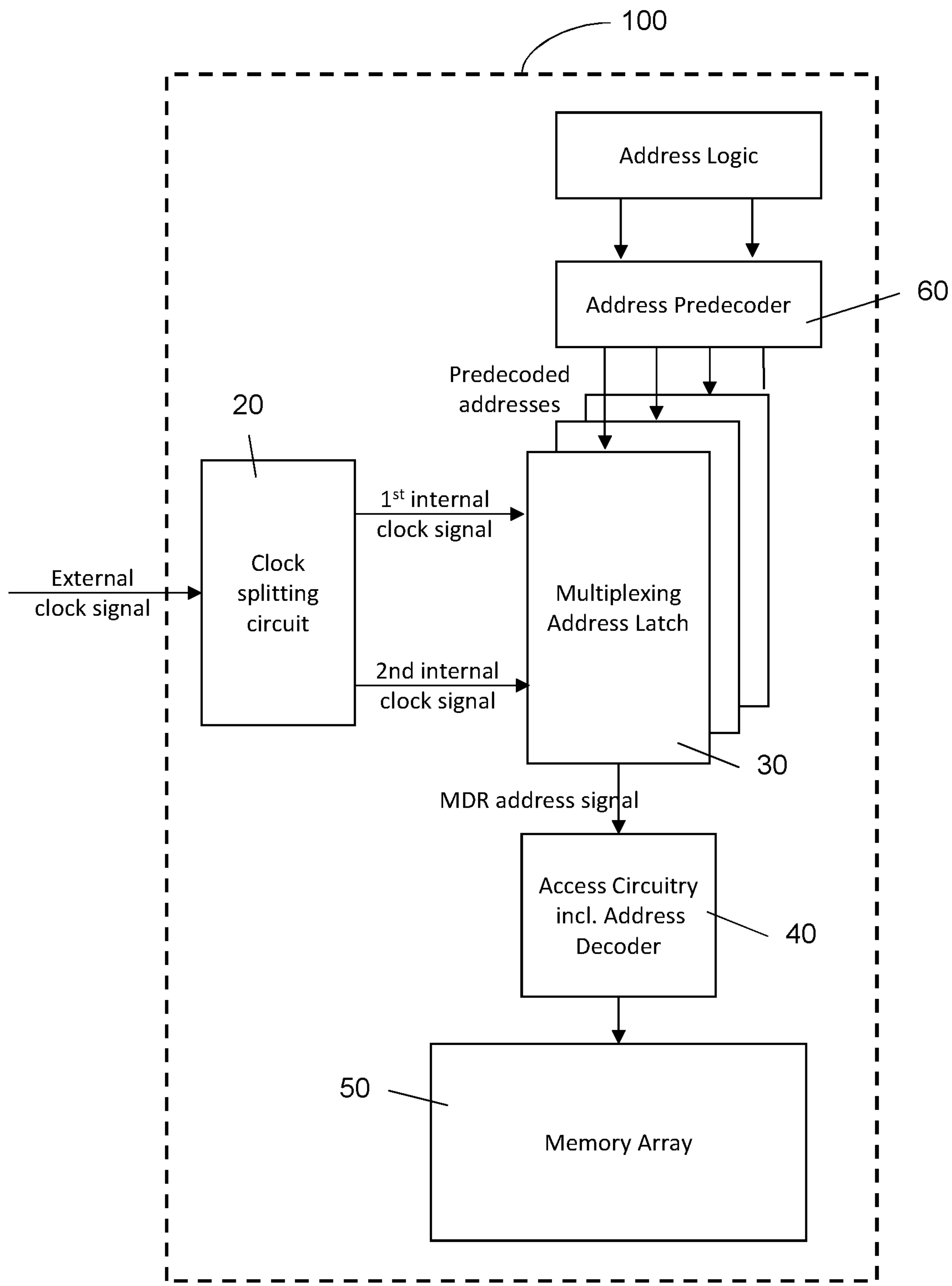
FIG. 3 illustrates schematically an example of a multiple data rate memory as described herein.

FIG. 3 illustrates a multiple data rate memory 100 comprising a clock splitting circuit 20 and a multiplexing address latch 30. The clock splitting circuit 20 is configured to generate first and second internal clock pulses from a rising edge of an external clock signal and to provide the first and second internal clock signals to the multiplexing address latch 30. The multiplexing address latch 30 is then configured to output a first address signal in response to the first internal clock pulse and a second address signal in response to the second internal clock pulse. The first address signal and second address signal will be output by the multiplexing address latch 30 on a single address bus as a multiple data rate signal.

Whilst FIG. 3 shows the clock splitting circuit 20 generating just two internal clock signals, as will be made clear, it is equally possible for the clock splitting circuit to generate more than two internal clock signals from the rising edge of the external clock.

The multiplexing address latch 30 is configured to output the first address signal and the second address signal to some access control circuitry 40 that controls access to an array of memory cells 50 within the memory 100. The access control circuitry 40 is configured to implement a first access to the array of memory cells 50 using the first address signal, which is provided to the access control circuitry 40 in response to the first internal clock signal, and a second access to the array of memory cells 50 using the second address signal, which is provided to the access control circuitry 40 in response to the second internal clock signal.

Typically, this access control circuitry 50 would include an address decoding circuit. The first address signal and second address signal output by the multiplexing address latch 30 could be the predecoded addresses that are further decoded by the address decoding circuit in order to initiate an access to the appropriate memory cells. In this case, the memory 100 would further comprise an address predecoder 60. For a single instance of a memory access, the address predecoder 60 is configured to receive associated address signals as an input and predecode these input address signals ready for further decoding by an address decoding circuit. Each of these predecoded address signals are then provided to a corresponding multiplexing address latch 30 that will multiplex the predecoded address signal with one or more further predecoded address signals into a multiple data rate signal that is then provided to the address decoding circuit.

Figure 4:
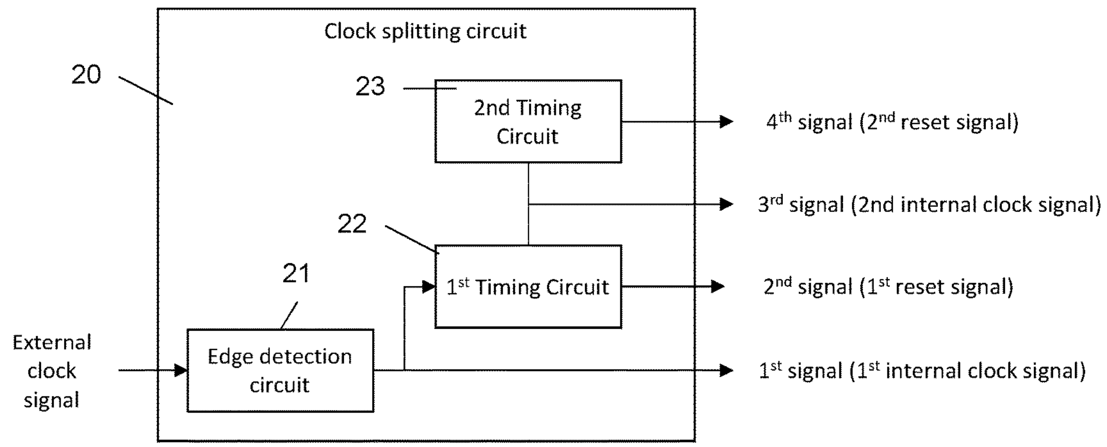
FIG. 4 illustrates schematically an example of a clock splitting circuit for use in the multiple data rate memory described herein.

FIG. 4 illustrates schematically an example of a clock splitting circuit 20 for use in the multiple data rate memory 100 described herein. Specifically, the clock pulse splitting circuit 20 is configured to generate a multiple data rate internal clock signal from a rising edge of an external clock signal. In the example of FIG. 4, the clock splitting circuit 20 comprises an edge detection circuit 21, a first timing circuit 22, and a second timing circuit 23. The edge detection circuit 21 is configured to generate a first signal in response to a rising edge of an external clock signal. The edge detection circuit 21 outputs this first signal as a first internal clock signal that is used to initiate a first memory access. The edge detection circuit 21 also outputs this first signal to the first timing circuit 22. The first timing circuit 22 is then configured to, in response to the first signal, replicate/emulate delays incurred during the first memory access and thereby generate both a second signal and a third signal. The first timing circuit 22 outputs the second signal to indicate completion of the first memory access. The first timing circuit 22 outputs the third signal as a second internal clock signal that is used to initiate a second memory access. The first timing circuit 22 also outputs this third signal to the second timing circuit 23. The second timing circuit 23 is then configured to, in response to the third signal, replicate/emulate delays incurred during the second memory access and thereby generate a fourth signal. The second timing circuit 23 outputs the fourth signal to indicate completion of the second memory access.

Figure 5:
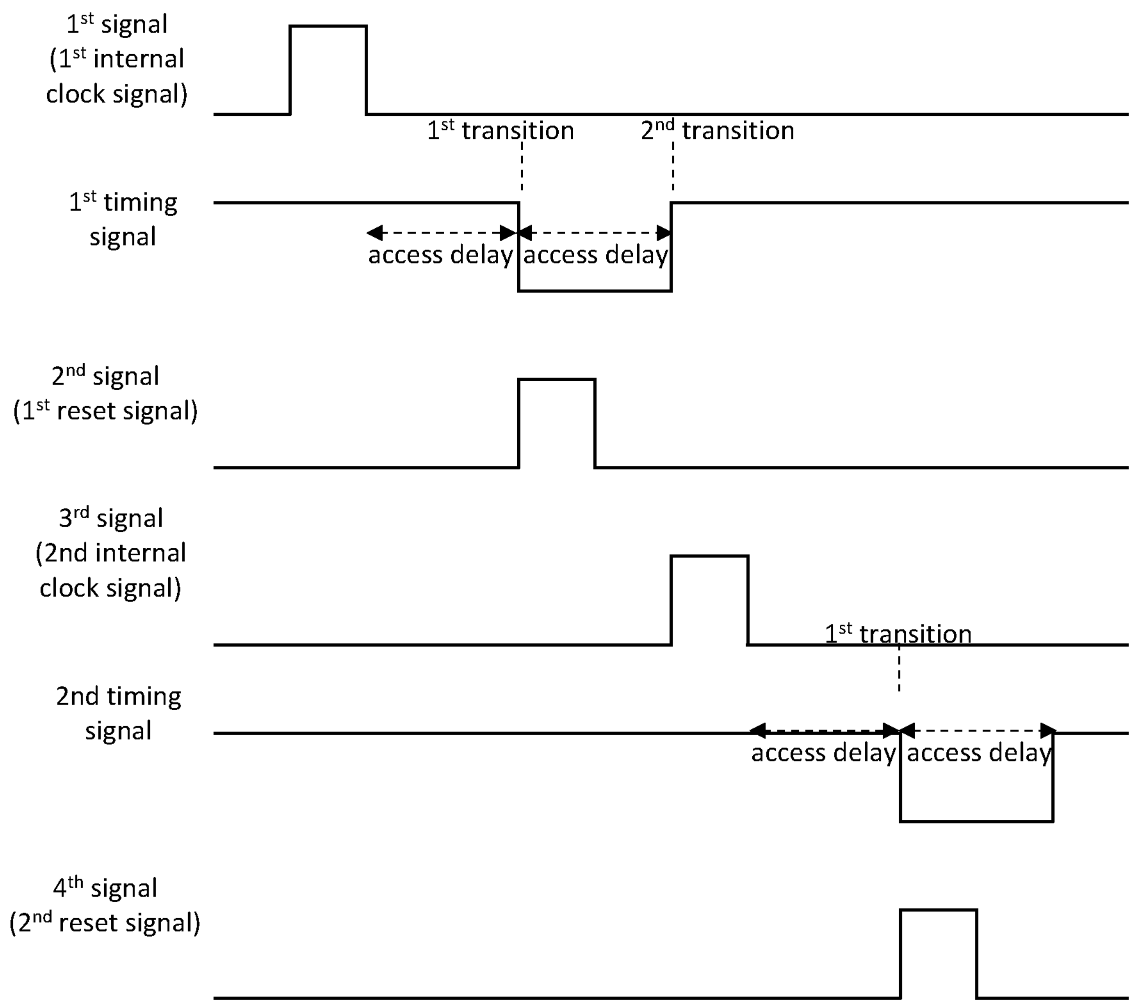
FIG. 5 illustrates schematically an example timing diagram of the clock splitting circuit described herein.

FIG. 5 illustrates an example timing diagram of the clock splitting circuit. The clock splitting circuit 20 therefore generates both a first internal clock signal and a second internal clock signal form a rising edge of the external clock signal, but also generates a first reset signal (i.e. the 2nd signal) that indicates completion of a first memory access initiate by the first internal clock signal and a second reset signal (i.e. the 4th signal) that indicates completion of a second memory access initiate by the second internal clock signal.

Figure 6:
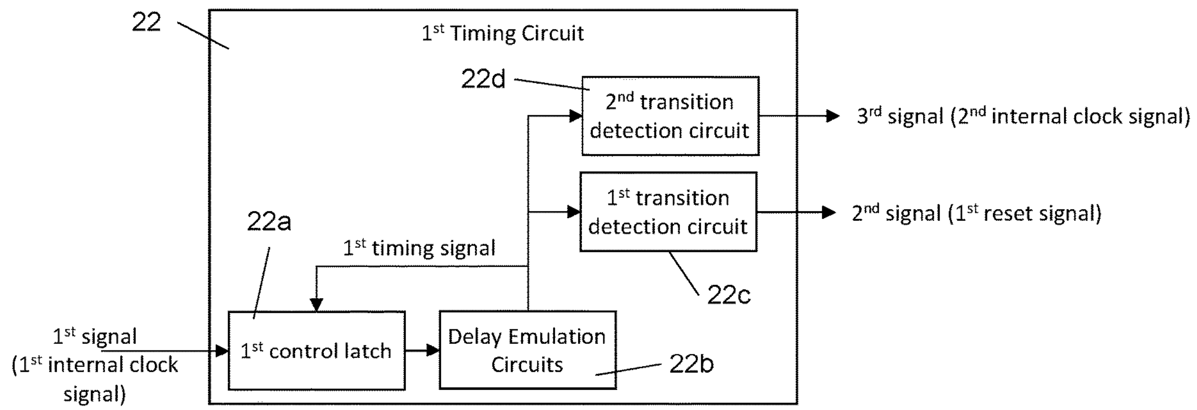
FIG. 6 illustrates schematically an example of a first timing circuit of the clock splitting circuit described herein.

FIG. 6 illustrates schematically an example of a first timing circuit 22 suitable for use in the clock splitting circuit described herein. The first timing circuit 22 is configured to generate a first timing signal that transitions between (high and low) states following the replicated/emulated delays incurred during the first memory access. The first timing circuit 22 is further configured to generate the second signal (i.e. the first reset signal) in response to a first transition of the first timing signal, and to generate the third signal (i.e. the second internal clock signal) in response to a second transition of the first timing signal.

In the example of FIG. 6, the first timing circuit 22 comprises a first control latch **22*a* and one or more delay replication/emulation circuits 22*b*. The first control latch 22*a* is configured to transition an output (e.g. change the state of the output to high) in response to receipt of the first signal (from the edge detection circuit 21) and to further transition the output (e.g. change the state of the output to low) in response to the first transition of the first timing signal. The one or more delay replication/emulation circuits 22*b* are configured to receive the output of the first control latch 22*a*** as an input and output the first timing signal.

Consequently, the first control latch **22*a* will transition its output (e.g. change the state of the output to high) in response to receipt of the first signal from the edge detection circuit 21. This transition of the first control latch 22*a* output will then propagate through one or more delay replication/emulation circuits 22*b* such that the first timing signal output by the one or more delay replication/emulation circuits 22*b* will also transition following the replicated/emulated delay. This first transition of the first timing signal is then fed back to the first control latch 22*a* causing a further transition of its output (e.g. change the state of the output to low). This further transition of the first control latch 22*a* output will again propagate through one or more delay replication/emulation circuits 22*b*** resulting in the second transition of the first timing signal following the replicated/emulated delay.

In the example of FIG. 6, the first timing circuit 22 further comprises a first transition detection circuit **22*c* and a second transition detection circuit 22*d*. The first transition detection circuit 22*c* is configured to generate the second signal (i.e. the first reset signal) in response to the first transition of the first timing signal. The second transition detection circuit 22*d*** is then configured to generate the third signal (i.e. the second internal clock signal) in response to the second transition of the first timing signal.

Figure 7:
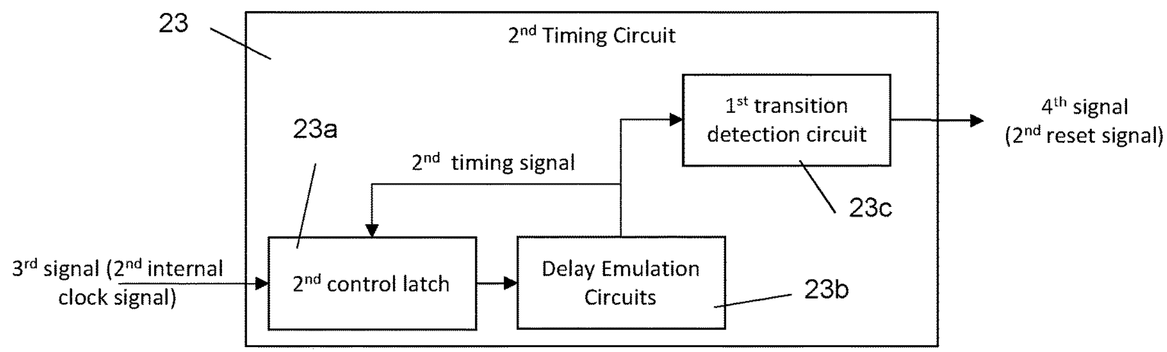
FIG. 7 illustrates schematically an example of a second timing circuit of the clock splitting circuit described herein.

FIG. 7 illustrates schematically an example of a second timing circuit 23 suitable for use in the clock splitting circuit described herein. The second timing circuit 23 is configured to generate a second timing signal that transitions between (high and low) states following the replicated/emulated delays incurred during the second memory access. The second timing circuit 23 is further configured to generate the fourth signal (i.e. the second reset signal) in response to a first transition of the second timing signal.

In the example of FIG. 7, the second timing circuit 23 comprises a second control latch **23*a* and one or more further delay replication/emulation circuits 23*b*. The second control latch 23*a* is configured to transition an output (e.g. change the state of the output to high) in response to receipt of the third signal (from first timing circuit 22) and to further transition the output (e.g. change the state of the output to low) in response to the first transition of the second timing signal. The one or more further delay replication/emulation circuits 23*b* are configured to receive the output of the second control latch 23*a*** as an input and output the second timing signal.

Consequently, the second control latch **23*a* will transition its output (e.g. change the state of the output to high) in response to receipt of the third signal from first timing circuit 22. This transition of the second control latch 23*a* output will then propagate through one or more further delay replication/emulation circuits 23***b* such that the second timing signal output by the one or more further delay replication/emulation circuits 23*b* will also transition following the replicated/emulated delay. This first transition of the second timing signal is then fed back to the second control latch 23*a* causing a further transition of its output (e.g. change the state of the output to low).

In the example of FIG. 7, the second timing circuit 23 further comprises a first transition detection circuit 23*c*. The first transition detection circuit 23*c* is configured to generate the fourth signal (i.e. the second reset signal) in response to the first transition of the second timing signal.

The first timing circuit 22 therefore generates both the first reset signal (i.e. the 2nd signal) that indicates completion of the first memory access initiated by the first internal clock signal and the second internal clock signal (i.e. the $3^{rd}$ signal), whilst the second timing circuit 23 generates the second reset signal (i.e. the 4th signal) that indicates completion of the second memory access initiated by the second internal clock signal.

Figure 8:
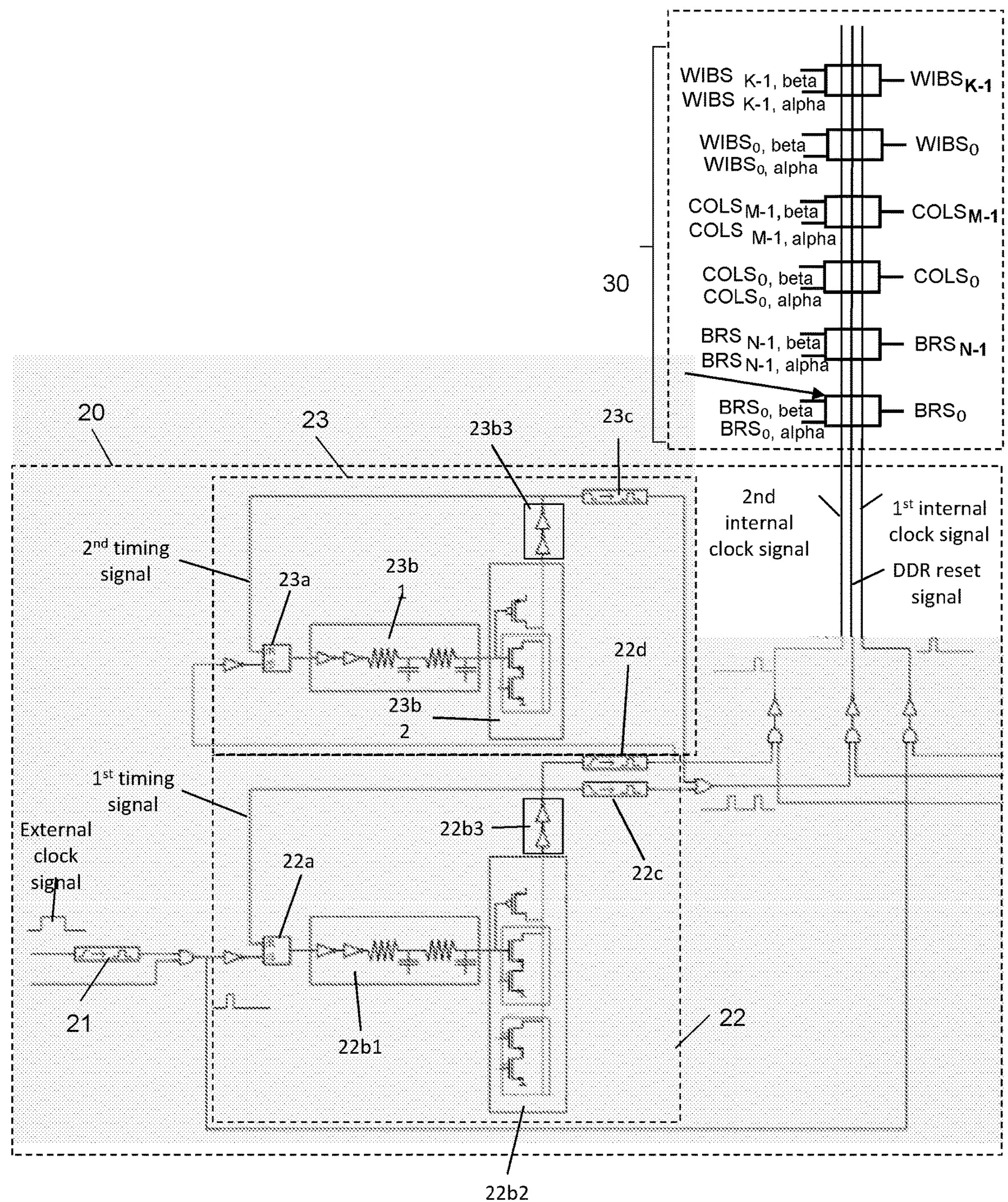
FIG. 8 illustrates an example of the clock splitting circuit described herein.

FIG. 8 illustrates a specific example of such a clock splitting circuit 20 that is configured to generate first and second internal clock pulses from a rising edge of an external clock signal. In this specific example, the edge detection circuit 21 detects a rising edge of the external clock signal and outputs the first signal to set the first control latch 22*a* via an inverter.

The output of the first control latch 22*a* is then provided to decoder delay emulation circuit 22*b*1 that is configured to simulate delays incurred when decoding memory addresses during a memory access. In this example, the decoder delay emulation circuit 22*b*1 mimic propagation delay through the decoder logic by emulating the number of inverting gate stages, signal buffering, and including possible wiring and loading delays (represented by the resistor-capacitor elements).

The output of the decoder delay emulation circuit 22*b*1 is then provided to a bit line delay imitation/simulation circuit 22*b*2 that is configured to simulate delays incurred when accessing addressed memory cells during a memory access. In this specific example, the bit line delay imitation/simulation circuit 22*b*2 is essentially a dummy model of the memory array. The charging time is determined by the PMOS pull-up device which mimics the array precharge devices, whilst the discharge is determined by NMOS pull-down devices which mimic the memory cells.

The output of the bit line delay imitation/simulation circuit 22*b*2 is then provided to a read buffer delay imitation/simulation circuit 22*b*3 that is configured to simulate delays incurred when accessing addressed memory cells through a read buffer during a memory access. In this specific example, the read buffer delay imitation/simulation circuit 22*b*3 comprises a buffer in the form of two consecutive inverters.

The first timing signal is output by the read buffer delay imitation/simulation circuit 22*b*3 and is provided to the first transition detection circuit 22*c* that generates the second signal (i.e. the first reset signal) in response to the first transition of the first timing signal that arises from the setting of the first control latch 22*a* following the replicated/emulated delay. The first timing signal is also fed back to reset the first control latch 22*a*. This resetting of first control latch 22*a* output then propagates through delay replication/emulation circuits 22*b* resulting in the second transition of the first timing signal, which is then detected by the second transition detection circuit 22*d*. The second transition detection circuit 22*d* therefore generates the third signal (i.e. the second internal clock signal) in response to the second transition of the first timing signal.

The second transition detection circuit 22*d* also outputs the third signal to set the second control latch 23*a* via an inverter. The output of the second control latch 23*a* then propagates through a further decoder delay emulation circuit 23*b*1, a further bit line delay imitation/simulation circuit 23*b*2, and a further read buffer delay imitation/simulation circuit 223*b*3, such that the setting of the second control latch 23*a* results in a first transition of the second timing signal following the replicated/emulated delay. The first transition detection circuit 23*c* of the second timing circuit 23 then generates the fourth signal (i.e. the second reset signal). The second timing signal is also fed back to reset the second control latch 23*a* following the replicated/emulated delay.

Figure 9:
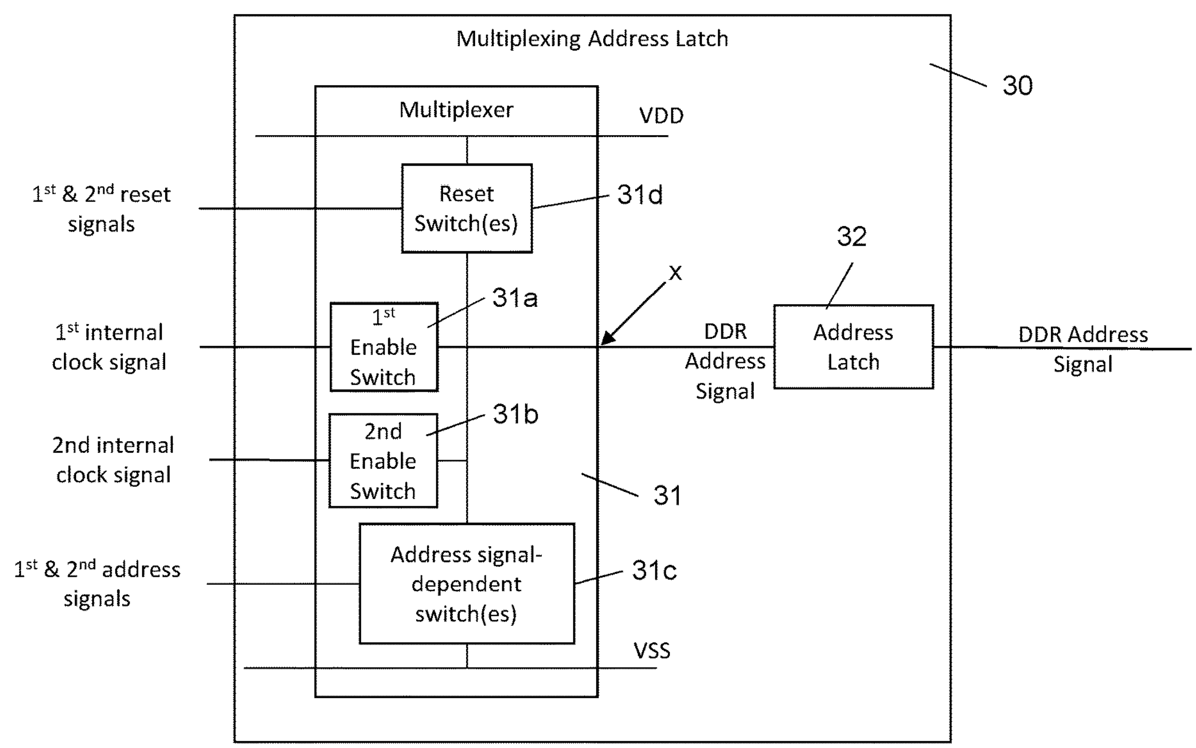
FIG. 9 illustrates schematically an example of a time multiplexing latch for use in the multiple data rate memory described herein.

FIG. 9 illustrates schematically an example of a multiplexing address latch 30 suitable for use in the multiple data rate memory 100 described herein. The multiplexing address latch 30 comprises a multiplexer 31 and an address latch 32. The address latch 32 is configured to receive and retain an address signal output by the multiplexer 31 and to provide the received address signal to the access control circuitry 40. In particular, the address latch 32 is configured to retain the address signal output by the multiplexer 31 until reset.

In FIG. 9, the multiplexer comprises a first enable switch 31*a* that is activated by the first internal clock signal and a second enable switch 31*b* that is activated by the second internal clock signal. Each of the first and second enable switches 31*a*, 31*b* connects an output of the multiplexer 31 to a negative supply/ground (VSS) via an address signal-dependent switch 31*c*.

The multiplexing address latch 30 is also configured to be reset by one or more reset signals. For this purpose, the multiplexing address latch 31 further comprises one or more reset switches 31*d* that connect an output of the multiplexer to a positive supply.

Figure 10:
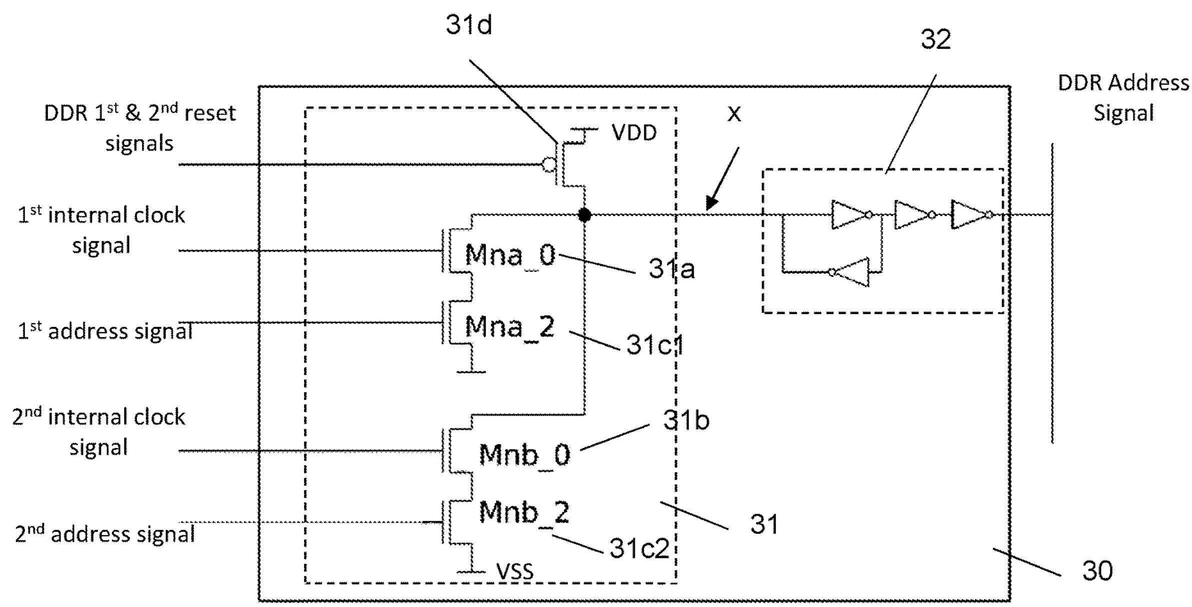
FIG. 10 illustrates a first example of the time multiplexing latch described herein.

FIG. 10 illustrates a first example of such a multiplexing address latch. In this example, the first and second enables switches 31*a*, 31*b* are each provided by an NMOS transistor, the gate of each transistor being connected to the first and second internal clock signals respectively. The first enable switch 31*a* connects the output of the multiplexer 31 to a negative supply/ground (VSS) via a first address signal-dependent switch 31*c*1, whilst the second enable switch 31*b* connects the output of the multiplexer 31 to a negative supply/ground (VSS) via a separate, second address signal-dependent switch 31*c*2. In this example, both the first and second address signal-dependent switches 31*c*1, 31*c*2 also each comprise an NMOS transistor, with the gate of the NMOS transistor being connected to the first and second address signals respectively.

The multiplexer 31 then also comprises a single reset switch 31*d* that connects an output of the multiplexer 31 to a positive supply. This single reset switch 31*d* is then configured to be activated by a multiple data rate reset signal for which occurrences of the reset signal occur between internal clock pulses. In this example, the reset switch 31*d* comprises a PMOS transistor having a gate connected to the multiple data rate reset signal input.

The multiplexing address latch 30 is therefore essentially a dynamic logic gate with a keep latch. Preferably, the multiplexing address latch 30 would be configured such that the internal node (x) of is pulled high whenever reset signal is low. The output of this multiplexing address latch 30 is the complement of x, and the address latch 32 maintains its state. The internal node (x) may then be pulled low depending on the states of input address signals when either of the first or second enable switch 31*a*, 31*b* is turned on. For correct operation, this multiplexing address latch 30 requires that the reset signal provided to the reset switch 31*d* is high whenever the first and second internal clock signals are applied in order to avoid a potential fight for the internal node. The PMOS pull up transistor providing the reset switch 31*d* and NMOS pull down transistors need to be strong enough to overcome the address latch 32.

Figure 14:
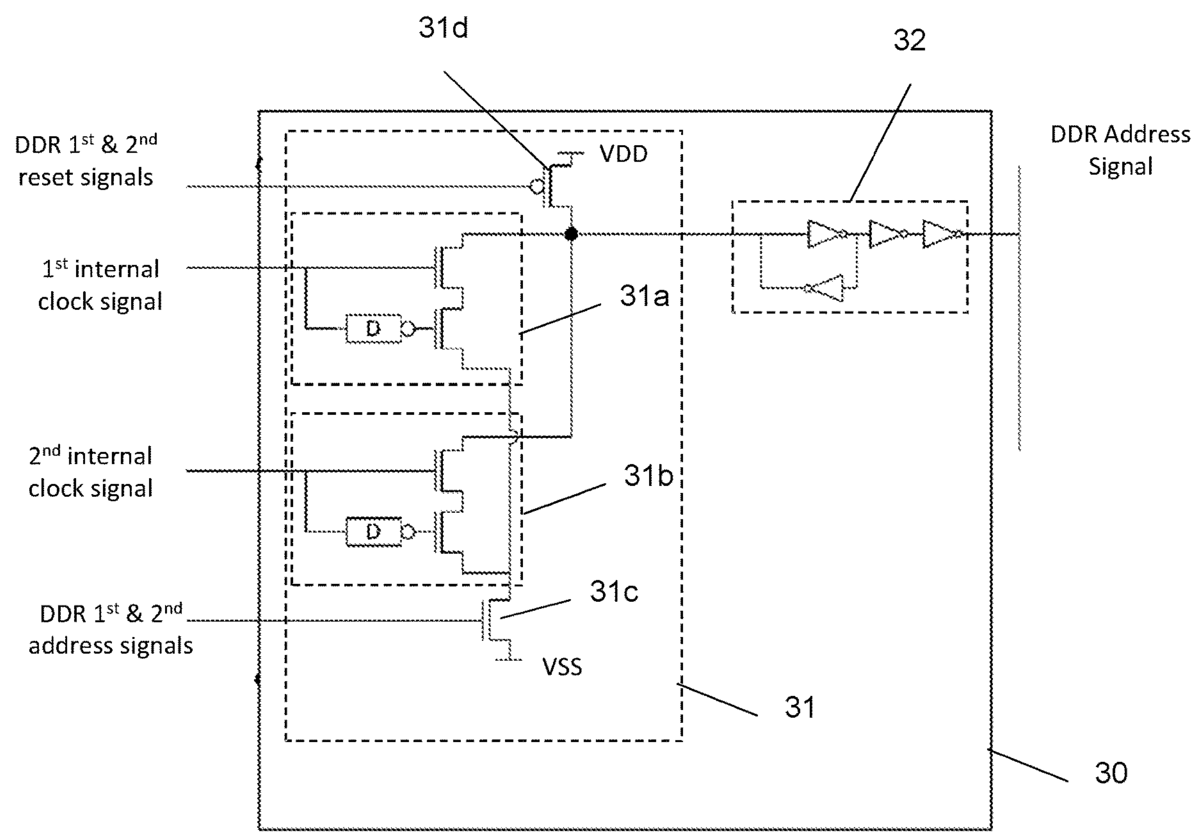
FIG. 14 illustrates a fifth example of the time multiplexing latch described herein.

Depending upon the specific arrangement of the multiplexing address latch 30, then both the first and second enable switches 31*a*, 31*b* can connect an output of the multiplexer 31 to the negative supply/ground (VSS) via a single address bit-dependent switch 31*c* that is activated by a multiple data rate address signal comprising both the first address signal and the second address signal. The multiplexer 31 is then provided with an input through which both the first address signal and the second address signal are received as a multiple data rate signal that controls the address bit-dependent switch 31*c*. For example, FIG. 14 illustrates an example of such a multiplexing address latch 30 wherein the address bit-dependent switch 31*c* is provided by an NMOS pull-down transistor having a gate connected to the input and that will therefore be turned on when the multiple data rate signal is high.

Alternatively, the first enable switch 31*a* can connect an output of the multiplexer 31 to the negative supply/ground (VSS) via a first address bit-dependent switch 31*c*1 that is activated by the first address signal and the second enable switch 31*b* can then connect an output of the multiplexer 31 to a negative supply/ground (VSS) via a second address bit-dependent switch 31*c*2 that is activated by the second address signal. The multiplexer 31 is then provided with a first input through which the first address signal is received and a second input through which the second address signal is received. For example, FIGS. 10 to 13 all illustrate examples of such a multiplexing address latch 30. In these examples, the first address bit-dependent switch 31*c*1 and the second address bit-dependent switch 31*c*2 are each provided by separate NMOS pull-down transistors having a gate connected to the corresponding address input and that will therefore be turned on when the corresponding address signal is high.

Depending upon the specific arrangement of the multiplexing address latch 30, then one or both of the first enable switch 31*a* and the second enable switch 31*b* of the multiplexer 31 can comprise a transistor having a gate connected to the corresponding internal clock pulse. For example, FIG. 10 illustrates an example of a multiplexing address latch 30 wherein both the first and second enable switches 31*a*, 31*b* comprise an NMOS transistor having a gate connected to the first and second internal clock pulses respectively. By way of further example, FIG. 11 illustrates an example of a multiplexing address latch 30 wherein the second enable switch 31*b* comprises an NMOS transistor having a gate connected to the second internal clock pulse.

Alternatively, one or both of the first enable switch 31*a* and the second enable switch 31*b* of the multiplexer 31 can comprise a first transistor connected in series with a second transistor, the first transistor having a gate connected to the corresponding internal clock pulse and the second transistor having a gate connected to an output of an inverting delay element, the corresponding internal clock pulse being provided as an input to the inverting delay element. In this example, the two transistors in series form a single current switching path that creates a brief time window following the rising edge of the corresponding internal clock pulse during which the switch is turned on. In other words, the two transistors in series functions as a pulse detector in order to implement edge triggering.

Figure 11:
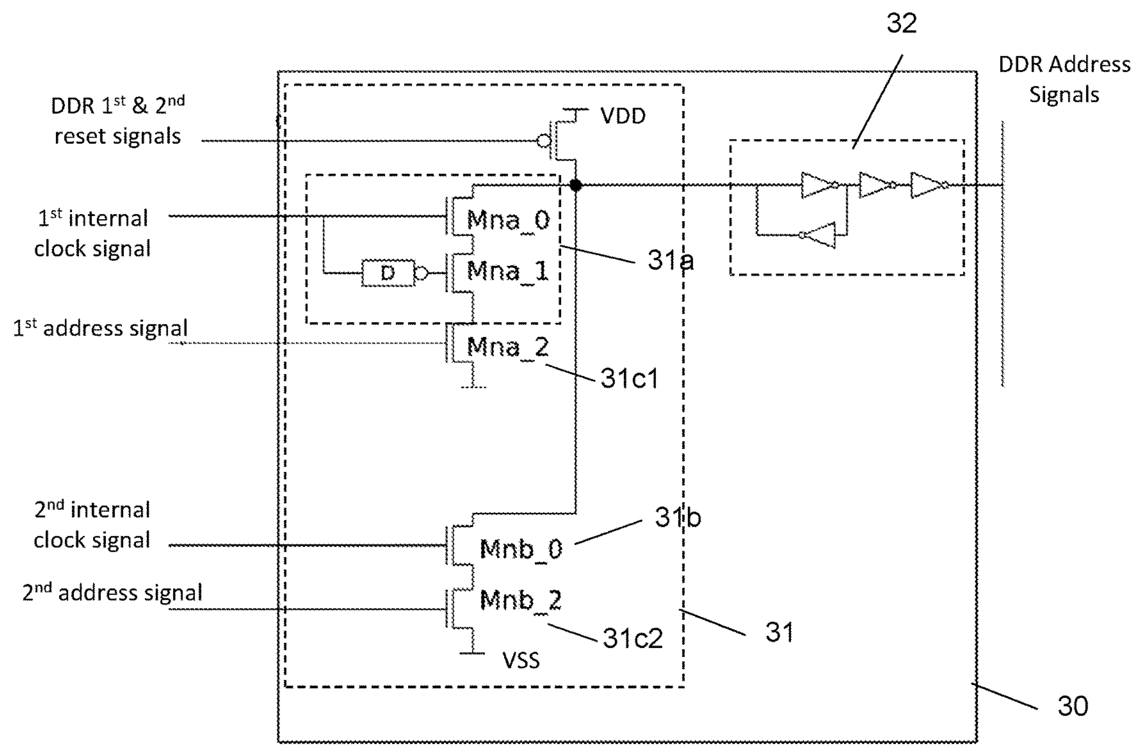
FIG. 11 illustrates a second example of the time multiplexing latch described herein.

For example, FIG. 11 illustrates an example of a multiplexing address latch 30 wherein the first enable switch 31*a* comprises a first NMOS transistor connected in series with a second NMOS transistor, the first NMOS transistor having a gate connected to the first internal clock pulse input and the second NMOS transistor having a gate connected to an output of an inverting delay element, the first internal clock pulse being provided as an input to the inverting delay element.

Figure 12:
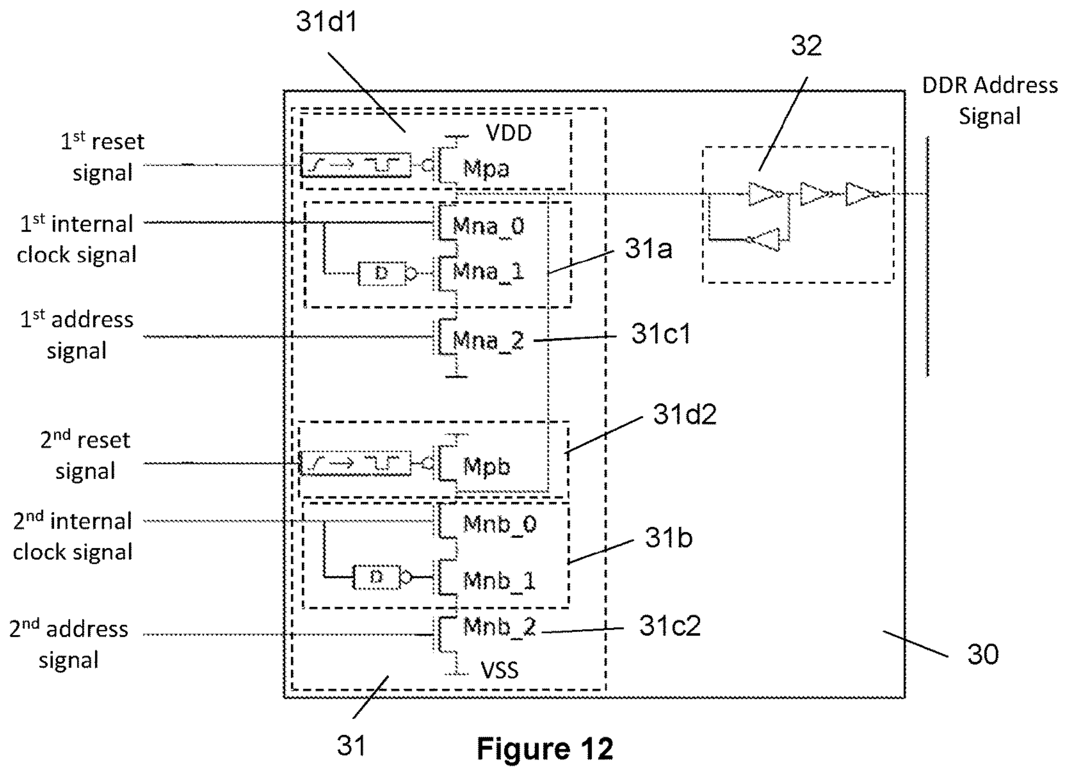
FIG. 12 illustrates a third example of the time multiplexing latch described herein.
Figure 13:
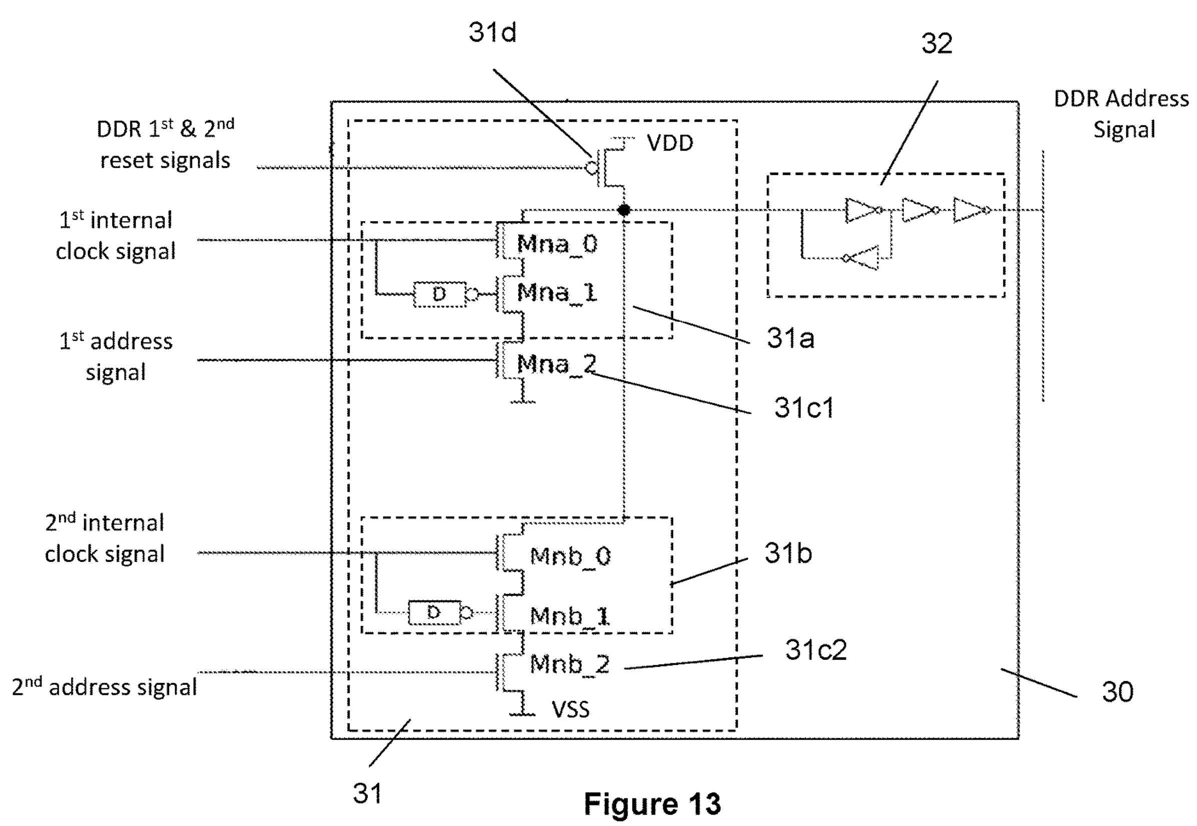
FIG. 13 illustrates a fourth example of the time multiplexing latch described herein.

By way of further example, FIGS. 12 to 14 all illustrate examples of such a multiplexing address latch 30 wherein both the first and second enable switches 31*a*, 31*b* comprise a first NMOS transistor connected in series with a second NMOS transistor, the first NMOS transistor having a gate connected to the corresponding internal clock pulse and the second NMOS transistor having a gate connected to an output of an inverting delay element, the corresponding internal clock pulse being provided as an input to the inverting delay element. In this example, the two series NMOS devices form a single current switching path that creates a brief time window following the rising edge of the corresponding internal clock pulse during which the switch is turned on.

As described above, for use in the multiple data rate memory 100 described herein the multiplexing address latch 30 is preferably configured to be reset by one or more reset signals. The multiplexing address latch 30 may therefore further comprise one or more reset switches 31*d* that connects an output of the multiplexer 31 to a positive supply.

Depending upon the specific arrangement of the multiplexing address latch 30, then the multiplexer 31 can comprise a single reset switch 31*d*. This single reset switch 31*d* is then configured to be activated by a multiple data rate reset signal for which occurrences of the reset signal occur between internal clock pulses. In particular, the clock splitting circuit 30 described herein can be configured to generate a multiple data rate reset signal for which an occurrence of the reset signal after each internal clock pulse and before a subsequent internal clock pulse. FIGS. 10, 11, 13 and 14 all illustrate examples such a multiplexing address latch 30 wherein the multiplexer 31 comprises a single reset switch 31*d*. In these examples, the reset switch 31*d* comprises a PMOS transistor having a gate connected to the multiple data rate reset signal input.

Alternatively, the multiplexer 31 can comprise both a first reset switch 31*d*1 and a second reset switch 31*d*2. The first reset switch 31*d*1 would then be configured to connect an output of the multiplexer 31 to a positive supply and would be activated by a first reset signal. Occurrences of the first reset signal would occur after the first internal clock pulse and before the second internal clock pulse. The second reset switch 31*d*2 would then be configured to connect the output of the multiplexer 31 to a positive supply and would be activated by a second reset signal. Occurrences of the second reset signal would occur after the second internal clock pulse and before a subsequent internal clock pulse. For example, FIG. 12 illustrates an example of a multiplexing address latch 30 wherein the multiplexer 31 comprises both a first reset switch 31*d*1 and a second reset switch 31*d*2. In this example, both the first reset switch 31*d*1 and the second reset switch 31*d*2 comprise a first PMOS transistor having a gate connected to the corresponding reset signal via an edge detection circuit.

In some cases, it may be preferable that the multiplexing address latches 30 are located in the centre of the memory array. In these cases, routing all of the input signals to theses multiplexing address latches 30 might be challenging. The example of FIG. 14 is therefore configured to use address signals that have been multiplexed onto the input of the multiplexing address latches 30, thereby halving the number of wires. Whilst this might appear to defeat the purpose of including the multiplexing address latches 30, the multiplexing of the input address signals is not time critical. Indeed, the only requirement is that on the rising edge of the first internal clock signal the first address signal is applied, and that on the rising edge of the second internal clock signal the second address signal is applied. This provides a window of time of approximately half the access time in which to ensure the required address signals are applied.

Figure 15:
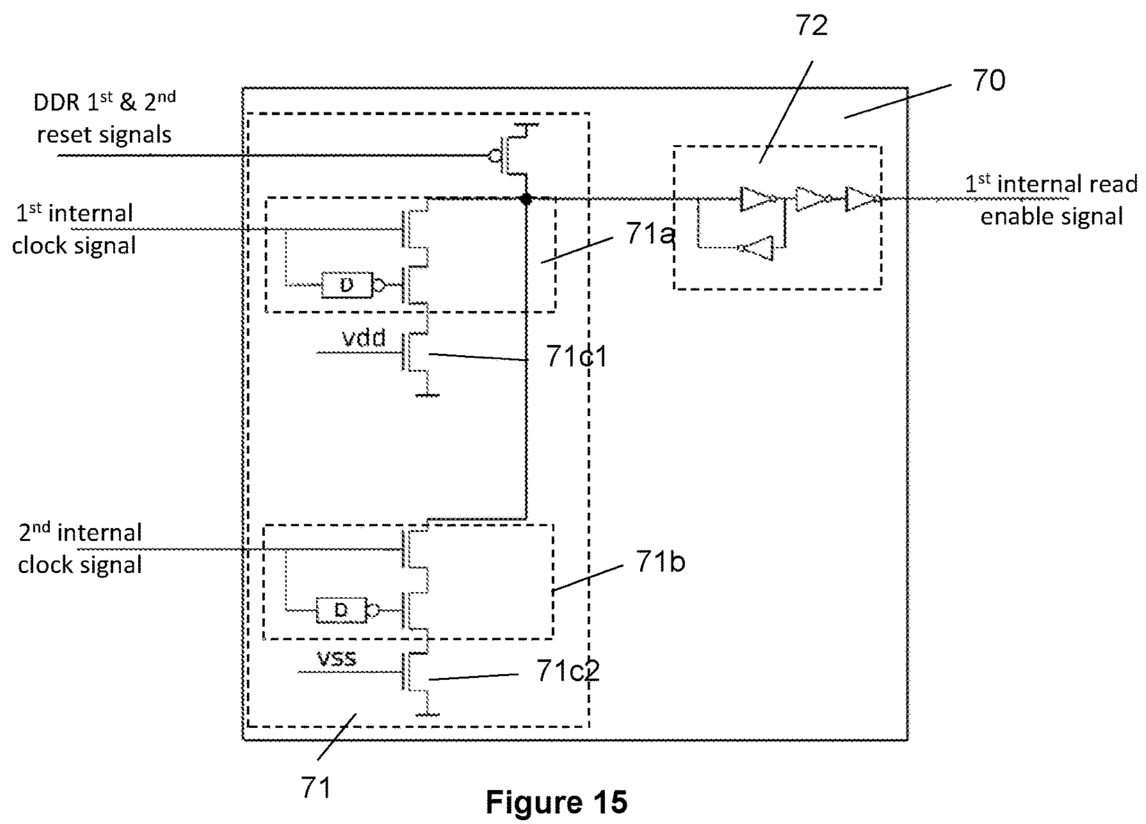
FIG. 15 illustrates a first example of a latch circuits for use in providing clock signals for to local read buffers within the multiple data rate memory described herein.
Figure 16:
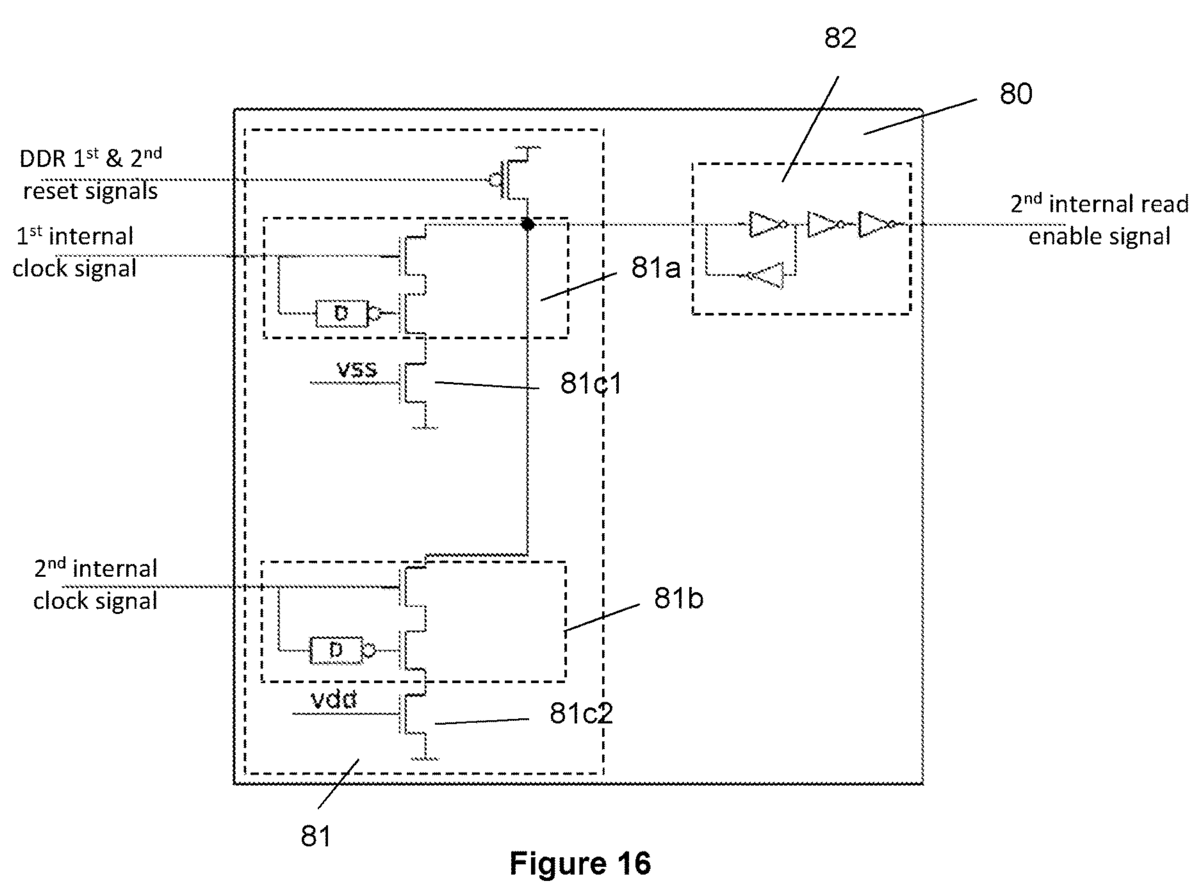
FIG. 16 illustrates a second example of a latch circuits for use in providing clock signals for to local read buffers within the multiple data rate memory described herein.

FIGS. 15 and 16 illustrate examples of circuits 70, 80 for use in providing read enable signals for use by local read buffers within the multiple data rate memory 100 described herein. In this regard, the local read buffers within the multiple data rate memory 100 will require one or other of a first and a second internal read enable signal that arise from the first and second internal clock signals respectively. It is preferable that the circuits used to generate these read enable signals re-use essentially the same circuit block as is used for the multiplexing address latch 30. The only significant difference between these circuits 70, 80 and multiplexing address latch 30 is that the address signals are not provided as inputs. Indeed, the switches 71*c*1, 71*c*2, 81*c*1, 81*c*2 that connect the output of the multiplexer 71, 81 to ground have fixed inputs of VDD and VSS respectively. The advantage of using such circuits are that they are easy to fit within the layout and that they will track the delay of the decoder signals.

The example of FIG. 15 is configured to provide a first internal read enable signal to a local read buffer. In this latch circuit 70, the first internal clock signal is provided as the input to the first enable switch 71*a*. The gate of NMOS pull-down transistor 71*c*1 that is connected in series with the first enable switch 71*a* is then connected to ground (VSS). The second internal clock signal is provided as the input to the second enable switch 71*b* of the latch circuit 70. The gate of NMOS pull-down transistor 71*c*2 that is connected in series with the second enable switch 71*b* is then connected to the positive supply (VDD). This latch circuit 70 will therefore only generate a pulse on the first internal read enable signal in response to the first internal clock signal.

The example of FIG. 16 is configured to provide a second internal read enable signal to a local read buffer. In this latch circuit 80, the first internal clock signal is provided as the input to the first enable switch 81*a*. The gate of NMOS pull-down transistor 81*c*1 that is connected in series with the first enable switch 81*a* is then connected to the positive supply (VDD). The second internal clock signal is provided as the input to the second enable switch 81*b* of the latch circuit 80. The gate of NMOS pull-down transistor 81*c*2 that is connected in series with the second enable switch 81*b* is then connected to the positive supply (VSS). This latch circuit 80 will therefore only generate a pulse on the second internal read enable signal in response to the second internal clock signal.

It will be appreciated that individual items described above may be used on their own or in combination with other items shown in the drawings or described in the description and that items mentioned in the same passage as each other or the same drawing as each other need not be used in combination with each other. In addition, any reference to "comprising" or "consisting" is not intended to be limiting in any way whatsoever and the reader should interpret the description and claims accordingly. Furthermore, although the invention has been described in terms of preferred embodiments as set forth above, it should be understood that these embodiments are illustrative only.

Those skilled in the art will be able to make modifications and alternatives in view of the disclosure which are contemplated as falling within the scope of the appended claims. For example, those skilled in the art will appreciate that the above-described invention might be equally applicable to other types of memory.

The invention claimed is:

1. A multiple data rate memory comprising:

a clock splitting circuit; and a multiplexing address latch;

wherein the clock splitting circuit is configured to generate first and second internal clock pulses from a rising edge of an external clock signal and to provide the first and second internal clock signals to the multiplexing address latch;

wherein the multiplexing address latch comprises a multiplexer and an address latch;

wherein the multiplexer comprises a first enable switch that is activated by the first internal clock signal and a second enable switch that is activated by the second internal clock signal, and wherein each of the first and second enable switches connects an output of the multiplexer to ground via an address signal-dependent switch; and wherein the multiplexing address latch is configured to output a first address signal in response to the first internal clock pulse and a second address signal in response to the second internal clock pulse.

2. The multiple data rate memory according to claim 1, wherein both the first and second enable switches connect the output of the multiplexer to ground via a single address signal-dependent switch that is activated by a multiple data rate address signal comprising both the first address signal and the second address signal.

3. The multiple data rate memory according to claim 2, wherein the multiplexer is provided with an input through which both the first address signal and the second address signal are received as a multiple data rate signal.

4. The multiple data rate memory according to claim 2, wherein the multiplexing address latch is configured to be reset by one or more reset signals.

5. The multiple data rate memory according to claim 4, wherein the multiplexing address latch further comprises a reset switch that connects the output of the multiplexer to a positive supply and that is activated by a multiple data rate reset signal for which occurrences of the reset signal occur between occurrences of the internal clock signals.

6. The multiple data rate memory according to claim 5, wherein the clock splitting circuit is further configured to generate an occurrence of the reset signal after each occurrence of the internal clock signal and before a subsequent occurrence of the internal clock signal.

7. The multiple data rate memory according to claim 5, wherein the reset switch comprises a transistor having a gate connected to the reset signal.

8. The multiple data rate memory according to claim 1, wherein the first enable switch connects the output of the multiplexer to ground via a first address signal-dependent switch that is activated by the first address signal and the second enable switch connects the output of the multiplexer to ground via a second address signal-dependent switch that is activated by the second address signal.

9. The multiply pumped/multiple data rate memory according to claim 8, wherein the multiplexer is provided with a first input through which the first address signal is received and a second input through which the second address signal is received.

10. The multiple data rate memory according to claim 1, wherein the first enable switch of the multiplexer comprises a transistor having a gate connected to the first internal clock signal.

11. The multiple data rate memory according to claim 1, wherein the first enable switch of the multiplexer comprises a first transistor connected in series with a second transistor, the first transistor having a gate connected to the first internal clock signal and the second transistor having a gate connected to an output of an inverting delay element, the first internal clock signal being provided as an input to the inverting delay element.

12. The multiple data rate memory according to claim 1 wherein the second enable switch of the multiplexer comprises a transistor having a gate connected to the second internal clock signal.

13. The multiple data rate memory according to claim 1, wherein the second enable switch of the multiplexer comprises a first transistor connected in series with a second transistor, the first transistor having a gate connected to the second internal clock signal and the second transistor having a gate connected to an output of an inverting delay element, the second internal clock signal being provided as an input to the inverting delay element.

14. The multiple data rate memory according to claim 1, wherein the multiplexing address latch further comprises:

a first reset switch that connects the output of the multiplexer to a positive supply and that is activated by a first reset signal for which occurrences of the first reset signal occur after the first internal clock signal and before the second internal clock signal; and a second reset switch that connects the output of the multiplexer to a positive supply and that is activated by a second reset signal for which occurrences of the second reset signal occur after the second internal clock signal and before a subsequent internal clock signal.

15. The multiple data rate memory according to claim 14, wherein the clock splitting circuit is further configured to generate an occurrence of the first reset signal after the first internal clock signal and before the second internal clock signal and to generate an occurrence of the second reset signal after the second internal clock signal and before a subsequent internal clock signal.

16. The multiple data rate memory according to claim 14, wherein the first reset switch comprises a first transistor having a gate connected to the first reset signal, and the second reset switch comprises a second transistor having a gate connected to the second reset signal.

17. The multiple data rate memory according to claim 1, and further comprising:

an array of memory cells; and access control circuitry for the array of memory cells;

wherein the multiplexing address latch is configured to output the first address signal and the second address signal to the access control circuitry.

18. The multiple data rate memory according to claim 17, wherein the access control circuitry is configured to implement a first access to the array of memory cells using the first address signal, which is provided to the access control circuitry in response to the first internal clock signal, and a second access to the array of memory cells using the second address signal, which is provided to the access control circuitry in response to the second internal clock signal.

19. The multiple data rate memory according to claim 17, wherein the address latch is configured to receive and retain an address signal output by the multiplexer and to provide the received address signal to the access control circuitry.

20. The multiple data rate memory according to claim 19, wherein the address latch is configured to retain the address signal output by the multiplexer until reset by a reset signal.

21. A clock splitting circuit for generating a multiple data rate internal clock signal from a rising edge of an external clock signal, the circuit comprising:

an edge detection circuit configured to generate a first signal in response to a rising edge of an external clock signal and to output the first signal as a first internal clock signal that initiates a first memory access;

a first timing circuit configured to, in response to the first signal, emulate delays incurred during the first memory access and thereby generate both a second signal that indicates completion of the first memory access and a third signal that is output as a second internal clock signal that initiates a second memory access; and a second timing circuit configured to, in response to the third signal, emulate delays incurred during the second memory access and thereby generate a fourth signal that indicates completion of the second memory access.

22. The clock splitting circuit according to claim 21, wherein the first timing circuit is configured to generate a first timing signal that transitions between states following the emulated delays incurred during the first memory access, to generate the second signal in response to a first transition of the first timing signal, and to generate the third signal in response to a second transition of the first timing signal.

23. The clock splitting circuit according to claim 22, wherein the first timing circuit comprises:

a first control latch; and one or more delay emulation circuits;

wherein the first control latch is configured to transition an output in response to receipt of the first signal and in response to the first transition of the first timing signal; and wherein the one or more delay emulation circuits are configured to receive the output of the first control latch as an input and output the first timing signal.

24. The clock splitting circuit according to claim 22, wherein the first timing circuit comprises:

a first control latch; and one or more delay emulation circuits;

wherein the first control latch is configured to transition an output in response to receipt of the first signal and in response to the first transition of the first timing signal;

wherein the one or more delay emulation circuits are configured to receive the output of the first control latch as an input and output the first timing signal;

a first transition detection circuit configured to generate the second signal in response to a first transition of the first timing signal; and a second transition detection circuit configured to generate the third signal in response to a second transition of the first timing signal.

25. The clock splitting circuit according to claim 21, wherein the second timing circuit is configured to generate a second timing signal that transitions between states following the emulated delays incurred during the second memory access and to generate the fourth signal in response to a first transition of the second timing signal.

26. The clock splitting circuit according to claim 25, wherein the second timing circuit comprises:

a second control latch; and one or more delay emulation circuits;

wherein the second control latch is configured to transition an output in response to receipt of the third signal and in response to the first transition of the second timing signal; and wherein the one or more delay emulation circuits are configured to accept the output of the second control latch as an input and output the second timing signal.

27. The clock splitting circuit according to claim 25, wherein the second timing circuit further comprises:

a second control latch; and one or more delay emulation circuits;

wherein the second control latch is configured to transition an output in response to receipt of the third signal and in response to the first transition of the second timing signal;

wherein the one or more delay emulation circuits are configured to accept the output of the second control latch as an input and output the second timing signal; and a first transition detection circuit configured to generate the fourth signal in response to a first transition of the second timing signal.

28. The clock splitting circuit according to claim 21, wherein one or both of the first timing circuit and the second timing circuit comprise one or more delay emulation circuits each selected from:

a decoder delay emulation circuit configured to simulate delays incurred when decoding memory addresses during a memory access;

a bit line delay emulation circuit configured to simulate delays incurred when accessing addressed memory cells during a memory access; and a read buffer delay emulation circuit configured to simulate delays incurred when accessing addressed memory cells through a read buffer during a memory access.

* * * * *